US005912500A

United States Patent [19]

Costello et al.

[11] Patent Number: 5,912,500

[45] Date of Patent: Jun. 15, 1999

[54] INTEGRATED PHOTOCATHODE

[75] Inventors: Kenneth A. Costello, Alameda County; Verle W. Aebi, San Mateo County; Robert E. Weiss, San Francisco County, all of Calif.

[73] Assignee: Intevac, Inc., Santa Clara, Calif.

[21] Appl. No.: 08/561,909

[22] Filed: Nov. 22, 1995

[51] Int. Cl.$^{6}$ .................... H01L 29/72

[52] U.S. Cl. .................... 257/434; 257/11; 257/184; 257/258; 257/294; 257/431; 257/448; 257/522

[58] Field of Search .................... 257/11, 258, 448, 257/522, 294, 431, 434, 184

[56] References Cited

U.S. PATENT DOCUMENTS

| | | | |
|---|---|---|---|
| 3,958,143 | 5/1976 | Bell | 313/94 |
| 5,047,821 | 9/1991 | Costello et al. | 257/184 |
| 5,326,978 | 7/1994 | Aebi et al. | 250/397 |
| 5,374,826 | 12/1994 | La Rue et al. | 250/397 |

OTHER PUBLICATIONS

Costello et al., "Transferred electron photocathode with greater than 5% quantum efficiency beyond 1 micron," *SPIE Proceedings,* vol. 1449, 1991, pp. 40–50.

La Rue et al., "High quantum efficiency photomultiplier with fast time response," *SPIE Proceedings,* vol. 2022, 1993, pp. 64–73.

Costello et al., "Transferred electron photocathode with greater than 20% quantum efficiency beyond 1 micron," *SPIE Proceedings,* vol. 2550, pp. 177–187.

*Primary Examiner*—Edward Wojciechowicz
*Attorney, Agent, or Firm*—Stanley Z. Cole

[57] ABSTRACT

A transferred-electron photocathode or other opto-electronic device having one light-receiving side and one electronic side, in which multiple photocathodes are processed concurrently on a wafer for front and back side contacts and anti-reflection layers. After the wafer-level processing, the individual cells are diced, and each is placed in a rectangular recess formed in a window body with the light-receptive part of the photocathode facing the window. The integration is aided by several novel processes including coining a chip recess into a window, selective etching of titanium over chromium, and using a single metal sheet member for electrically contacting the photocathode, forming part of the vacuum envelope, and providing an exterior electrical tab.

10 Claims, 12 Drawing Sheets

INTEGRATED PHOTOCATHODE

FIELD OF THE INVENTION

The invention generally relates to semiconductor devices and their method of making. In particular, the invention relates to semiconductor photocathodes usable in photomultiplier tubes and the like and their fabrication into operational devices.

BACKGROUND OF THE INVENTION

Photodetectors are widely used to detect the intensity of light impinging upon the photodetector by converting the flux of light photons into an electronic current, which is then measured by conventional electronic means. Two primary operational parameters of a photodetector are its sensitivity to light within the desired spectral band, that is, the size of the electrical current output by the photodetector relative to the number of photons incident upon the photodetector, and the noise output by the photodetector or its associated circuitry. A high light sensitivity is desired, but an adequately high signal-to-noise ratio must be maintained or the random noise signal will mask the light-derived signal.

Many types of photodetectors are available for the light spectrum ranging from the infrared to the ultraviolet. In particular, semiconductor photodiodes are readily available and moderately inexpensive and have found widespread use. However, their sensitivity is insufficient for some very advanced applications in the long wavelength region in which the light has a wavelength longer than about 1 $\mu$m, that is, an energy less than 1.24 eV. This range includes the 1.3 and 1.55 $\mu$m bands that are being used for optical fiber communication. It is expected that fairly inexpensive and rugged photodiodes made of III–V semiconductors will be operationally used in most applications. However, more demanding applications require a more sophisticated detector with a higher signal-to-noise ratio and a high bandwidth with low photon fluxes. One effective photodetector in the long-wavelength region is an intensified photodiode (IPD) tube based on a transferred electron (TE) photocathode. This photodetector is often referred to as a TE-IPD. In very general terms, long-wavelength photons incident on the photocathode cause the cathode to emit electrons. An electron detector then measures the number of electrons in the flux emanating from the photocathode.

Bell in U.S. Pat. No. 3,958,143 discloses a highly effective photocathode mechanism in this wavelength band. His structure involves a transferred electron device, for instance, including a p-type InGaAsP active layer sandwiched between a p-type InP substrate and a lightly doped InP surface layer. As is explained by Bell, when the resulting semiconducting structure is biased with the surface layer positive, electrons are injected into the conduction band of the InP surface layer. The injected electrons are promoted to higher-mass conduction valleys in the InP surface layer, and at these higher energies a significant fraction of the electrons will be transported with a minimal loss of energy through the Schottky barrier created at the semiconductor/metal interface between the InP surface layer and the electrode. Therefore, cathodes which have been activated with a surface layer of $Cs_xO_y$ in order to lower the energy of the electron vacuum level to below that of the high-mass valleys can demonstrate very high photoemission yields.

Costello et al. in U.S. Pat. No. 5,047,821 disclose a similar device structure and also provide some details of a gridded electrode structure which more effectively biases the thin metallization layer of the Schottky barrier.

Aebi et al. in U.S. Pat. No. 5,326,978 and La Rue et al. in U.S. Pat. No. 5,374,826 disclose a focussed electron beam (FEB) tube structure usable with the transferred electron (TE) photocathode of Costello et al. These patents, as well as describing the embodiment that uses the photocathode, also describe an embodiment that instead uses a multichannel plate, which is a planar photomultiplier tube, but that embodiment is not relevant to the present invention. In the structure of these patents that use the photocathode, a fairly large photocathode is positioned at one end of a tube and is biased negatively with respect to an electron detector at the other end. The photocathode converts long-wavelength photons to electrons with high efficiency. A set of annular electrodes are disposed about the axis between the photocathode and the electron detector in order to focus the electrons on the detector. This technology has also been described in the technical literature by Costello et al. in "Transferred electron photocathode with greater than 5% quantum efficiency beyond 1 micron," *SPIE Proceedings*, vol. 1449, 1991, pp. 40–50, by La Rue et al. in "High quantum efficiency photomultiplier with fast time response," *SPIE Proceedings*, vol. 2022, 1993, pp. 64–73, and by Costello et al. in "Transferred electron photocathode with greater than 20% quantum efficiency beyond 1 micron", *SPIE Proceedings,* vol. 2550, 1995, pp. 177–187.

Although such an FEB-TE tube, as described in the prior art, provides very high performance, it suffers several disadvantages, many of which are related, we have found, to the custom fabrication of its photocathode. The transferred-electron photocathode of Bell and Costello is based upon a III–V semiconductor heterostructure grown on InP substrates, which at the present time are typically available in a size having a 2-inch (50 mm) diameter. A conventional fabrication process will now be described for converting the deposited InP substrates into photocathode cells.

In a first step, the 2-inch InP wafer is grit blasted to form three 0.855-inch (18.6 mm) diameter circular cuts that are separated from each other. On average, at the end of processing and packaging, only two of the cuts form operable devices. That is, on average this process forms only two usable cuts from the 2-inch wafer. The grit blasting step typically requires two hours.

In a second step, each of the individual cuts is mechanically masked on its backside and an ohmic contact layer is e-beam deposited through the mask. A mechanical mask is a free-standing metallic sheet that has the desired pattern machined through it, and then the deposition beam is directed through the mechanical mask towards the substrate. The mechanical mask shadows the portions of the substrate not to be deposited upon. This masked deposition step typically requires 3 hours.

In a third step, the backside of each cut is again mechanically masked for the deposition of an anti-reflection coating by plasma-enhanced chemical vapor deposition (PECVD). This step typically requires 1 hour.

In a fourth step, the front of the cuts are deposited with a contact metal. This step typically requires 3 hours.

In a fifth step, the individual cuts have their frontsides photolithographically masked for a step of etching the contact grid pattern into the contact metal over the desired active region of the cathode. This step typically requires 4 hours.

These steps and their required times are summarized in TABLE 1.

TABLE 1

| | | |
|---|---|---|
| 1 | Grit blast | 2 hours |
| 2 | Mask back and deposit contact | 3 hours |
| 3 | Mask back and deposit AR coating | 1 hour |
| 4 | Deposit contact metal on front | 3 hours |
| 5 | Mask and etch contact grid pattern | 4 hours |
| TOTAL | | 13 hours |

These steps complete the fabrication of the individual photocathode cells, which are then manually assembled into the tubes. The table shows, however, that the process for completing fabrication on average of two photocathodes from a 2-inch wafer requires about 6.5 hours per photocathode. The prior-art fabrication is thus labor intensive and causes the resulting photodetector tubes to be expensive.

Wafers of InP grown with the desired TE heterostructure are expensive. The above prior-art process produces a typical yield of only two photocathodes per 2-inch wafer. Furthermore, the performance of TE photodetectors is limited by dark-current noise unless the photocathode is cooled. Extensive cooling is both expensive and cumbersome, but dark current can alternatively be reduced by reducing the size of the photocathode. This reduction can be shown by the fact that the noise effective power that is limited by dark current $NEP_{dc}$ can be expressed analytically as $$NEP_{dc}=\frac{hv}{\eta}\sqrt{\frac{2fJ_dA\Delta f}{e}}$$

where hv is the photon energy, $\eta$ is the quantum efficiency, f is the excess noise factor, $J_d$ is the dark current per unit area, A is the area of the detector, $\Delta f$ is the bandwidth in hertz, and e is the electronic charge. Hence $NEP_{dc}$ is proportional to the square root of the area of the photocathode and can be reduced by reducing the area. Lenses are available at the desired wavelengths so that size reduction does not degrade overall performance for most applications. Although both considerations suggest reducing the size of the photocathodes, the prior art steps of mechanical masking and even handling the cuts for steps such as photolithography become difficult when the cathode size is reduced to much below 0.8 inch (2 cm).

Finally, the prior-art process involved in fabricating the photocathode of Costello involves many manual steps, which are prone to error and difficult to incorporate into a production line.

SUMMARY OF THE INVENTION

An object of the invention is thus to provide a method of more economically fabricating photocathodes and other semiconductor optical devices.

A further object of the invention is to provide such a method which can easily fabricate such devices having a small area.

A yet further object of the invention is to provide such a method that minimizes manual operations.

The invention can be summarized as a method of fabricating a photocathode or other opto-electronic device from a stock wafer into a portion of a photodetector system.

According to one aspect of the invention, many of the steps can be performed at the wafer level upon many of the devices. After many of these steps are completed, the wafer is diced into multiple opto-electronic devices. Importantly, a fairly thick metal layer is deposited on one side to protect it while the other side is being processed. For a photocathode, the protected side is the electron-emitting side. After the other side is processed, the metal layer is etched for an electrode pattern.

According to another aspect of the invention, the opto-electronic chip has a light-sensitive side, and the chip is aligned and bonded within a recess of a window with its light-sensitive side facing the window. Preferably, the recess is formed in a glassy window by a forging process in which the window material is heated to softening and them stamped between two die.

DETAILED DESCRIPTION OF THE PREFERRED EMBODIMENTS

The invention relies upon wafer-level processing for most of the steps of forming the photocathode or other opto-electronic detector and also upon several novel features in its assembly into the tube.

A principal advantage of the invention is the economy of simultaneously processing many photocathodes on a single wafer by techniques related to those used in integrated circuit manufacturing.

Figure 1:
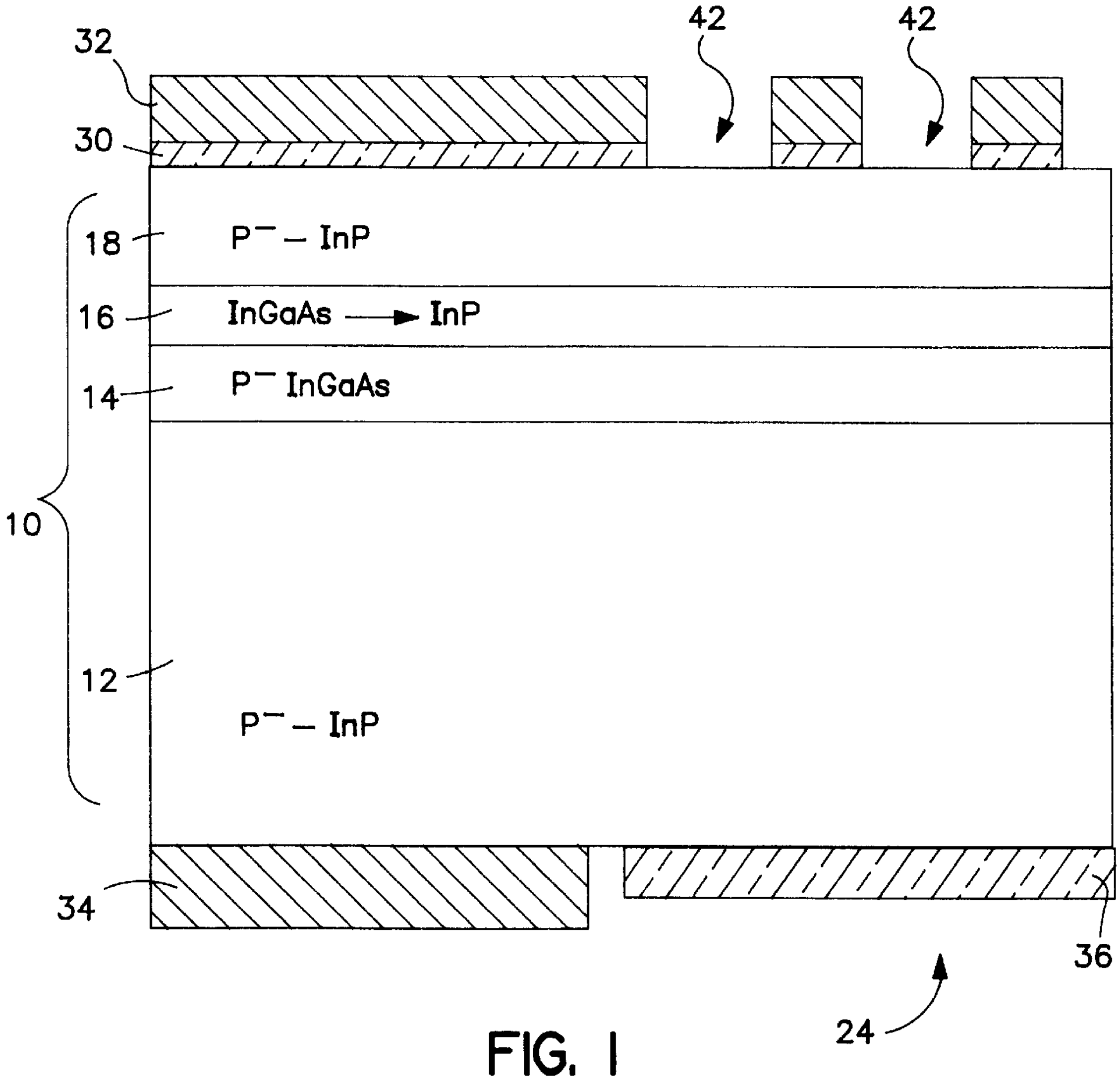
FIG. 1 is a cross-sectional view of a transferred-electron photocathode heterostructure usable with the invention as well as fragmentary portions of surface elements processed according to one aspect of the invention.

The process according to the principal described embodiment of the invention begins with an InP wafer already processed to contain a typical transferred heterostructure 10 shown in cross section in FIG. 1. The heterostructure follows those disclosed by either Bell, Costello et al., or LaRue et al. in their respective patents. For example, a (100)-oriented InP substrate 12 is lightly doped $p^-$-type with Zn so as to be essentially transparent to long-wavelength light incident on a bottom side thereof. A number of layers are epitaxially deposited on the substrate 12 by either organo-metallic chemical vapor deposition (OMCVD) or molecular beam epitaxy (MBE). The first layer is an absorption layer 14 of InGaAs having a bandgap wavelength of 1.65 $\mu$m, a thickness of about 1.5 $\mu$m, and doped sufficiently p-type to substantially absorb all light of wavelength shorter than the bandgap wavelength that is incident thereupon. A grading layer 16 is deposited over the absorption layer 14. It has a thickness of about 0.2 $\mu$m, is doped p-type with Zn, and its composition linearly varies from the InGaAs of the absorption layer 14 to InP. The grading layer 16 prevents an electron trap from developing in the conduction band at the edge of the heterojunction between the InGaAs and InP. An emitter layer 18 of lightly $p^-$doped InP is deposited over the grading layer 16 and completes the stock wafer structure 10. The heterostructure was chosen as an example only and can be used with a particular wavelength band at and below 1.65 $\mu$m. Other wavelengths could be chosen, and other semiconductor material systems can be used with the invention.

Figure 2:
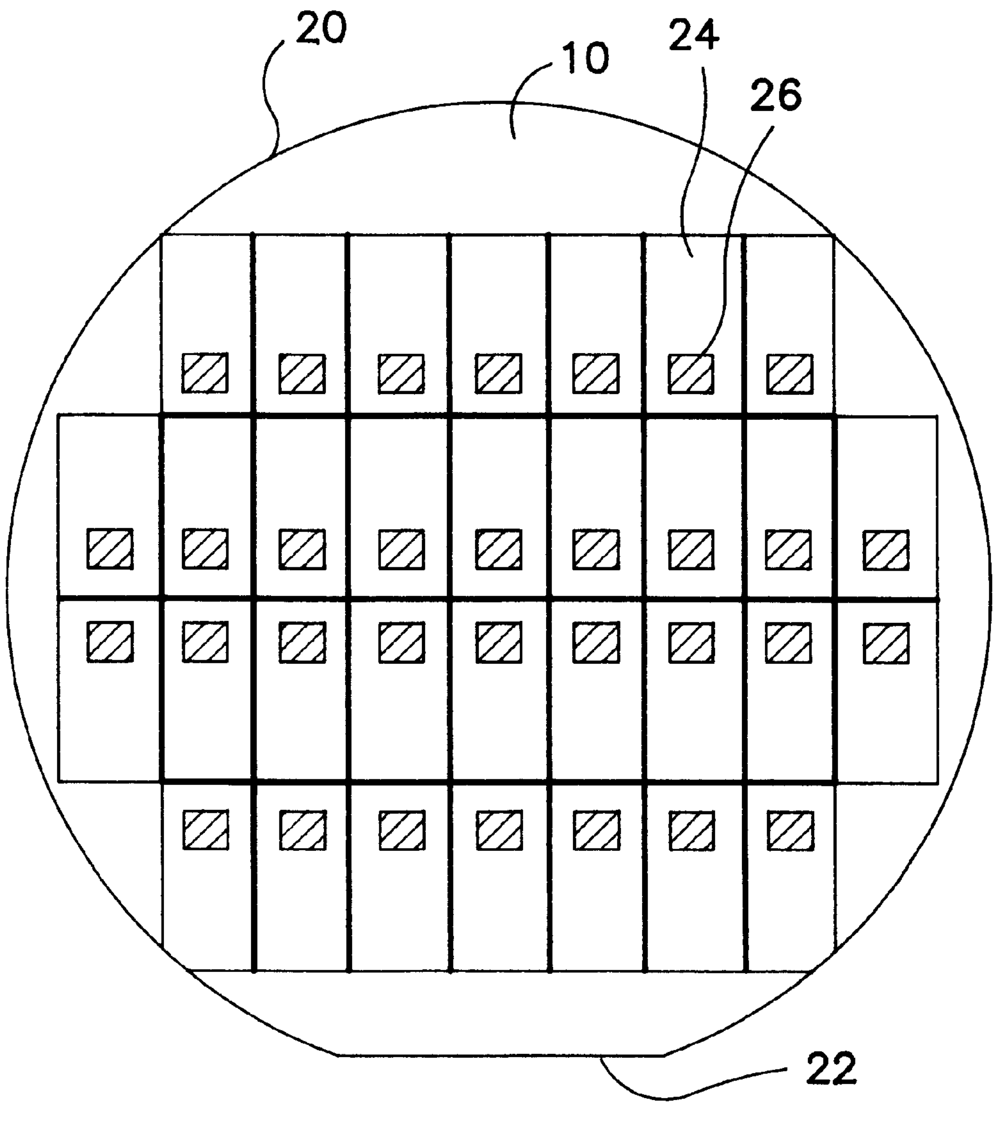
FIG. 2 is a plan view of the arrangement of multiple rectangular photocathodes on a wafer, as provided by the invention.

A wafer 20 with the heterostructure 10 is shown in top plan view in FIG. 2. The wafer 20 includes a flat 22 aligned with a (001) plane of the InP crystal structure. In an example of a design of the invention, the surface of the 2-inch (50 mm) InP wafer 20 is divided into 32 mostly rectangular cathode cells 24 each having an area of 5 mm×10 mm and each including a 2 mm×2 mm active area 26. A few of the cathode cells 24 can have a corner truncated, thereby increasing the total number of cells yielded from a wafer, because the active area 26 is not thereby affected and the remaining comers of the truncated cells can adequately align the cell within the recess to be described later.

The integrated processing of the entire wafer 20 will now be described.

Figure 3:
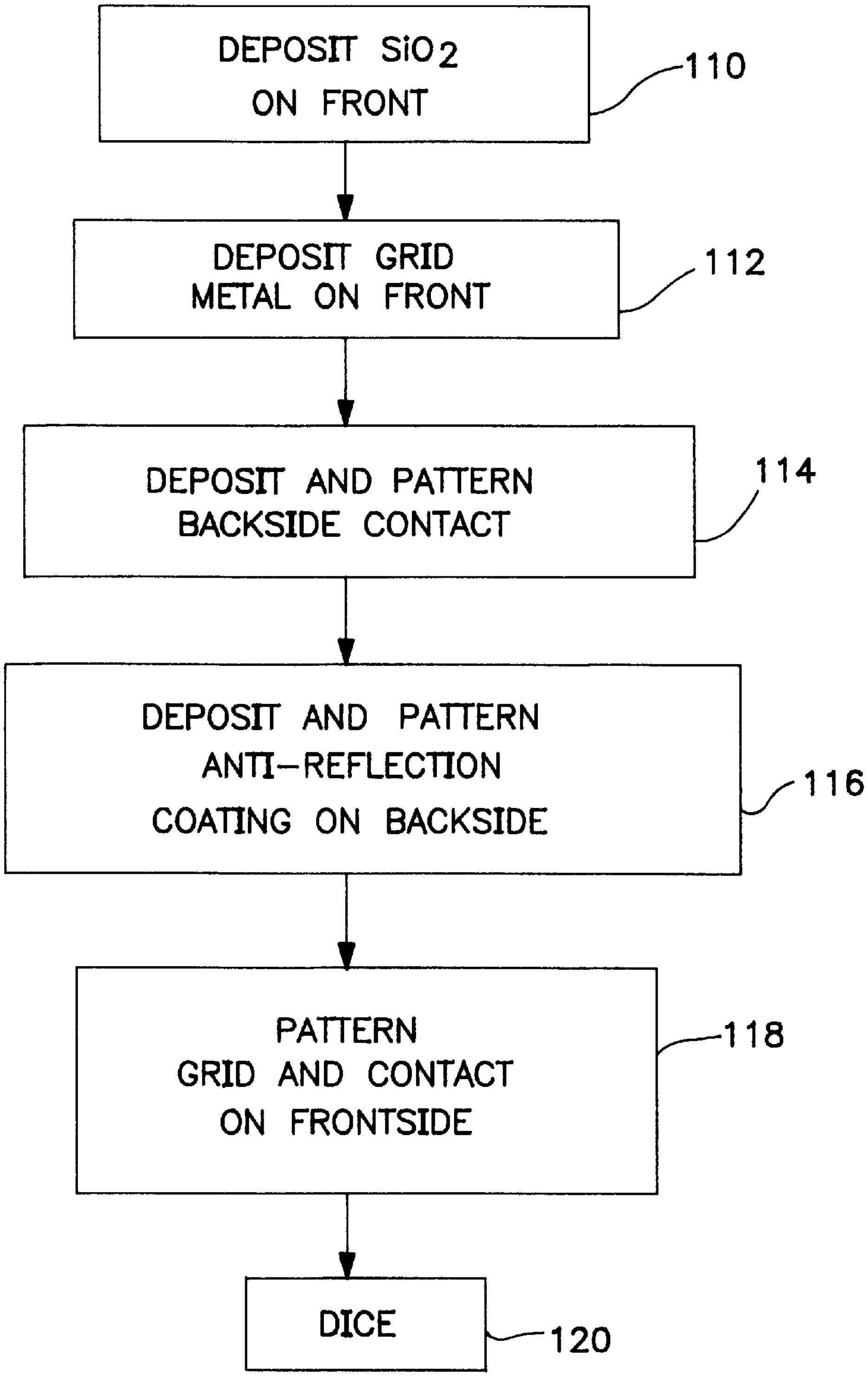
FIG. 3 is a flow diagram of a processing sequence of the invention for simultaneously performing many of the fabrication steps upon a number of photocathodes.

In a first step 110, shown in the processing flow diagram of FIG. 3, a thin layer 30 (see FIG. 1) of $SiO_2$ is deposited to a thickness of less than 30 nm, for example 25 nm, on the front surface of the wafer 20. The first step 110 typically requires 1 hour. In a second step 112, a planar layer 32 of grid metal, such as chromium, is deposited over the thin $SiO_2$ layer 30 by, for example, e-beam evaporation to a thickness of about 50 nm. Costello et al. have described the use of grids, but without the use of the underlying thin silica layer. A further improvement of this step, to be described later in more detail, involves depositing about 20 nm of titanium over the chromium layer in the same e-beam evaporation chamber. The titanium facilitates the lithography to be described below. An advantage of first depositing a hard unpatterned grid layer 32, e.g. of Cr or Cr/Ti is that it protects the thin underlying semiconductor layers during subsequent processing of the wafer backside, to now be described. The second step typically requires 3 hours.

In a third step 114, a mask is photolithographically deposited and patterned on the backside of the wafer 20 for the backside contact. The mask covers the back surface opposite to the active area 26 but leaves exposed a substantial portion of the backside opposite the portion of the frontside surrounding the cathode cell 24. A contact metal is then e-beam deposited over the patterned mask. The contact metal is a sandwich structure including layers of Au, Zn, and Au. The photoresist is then lifted off to remove the unwanted metal and to leave a patterned bottom contact 34. The third step typically requires 4 n hours.

In a fourth step 116, another mask is photolithographically deposited and patterned on the backside of the wafer 20 for the anti-reflection coating. The mask covers the previously deposited bottom contact 34 but leaves exposed the portion of the backside of the wafer opposite the active area 26. A layer of anti-reflection coating is then deposited by a process of low-temperature plasma-enhanced chemical vapor deposition (PECVD). The anti-reflection coating layer is preferably composed of silicon oxynitride that is silicon-rich so as to have a high refractive index of about 1.8. The silicon counters the incorporation of hydrogen which would lower the index of refraction, and its short-wavelength absorption is not material for long-wavelength detectors. The optical thickness of the anti-reflection coating layer is one-quarter of the wavelength within the silicon oxynitride so as to effectively couple light in the 1300–1500 nm band. It is preferably deposited at about 80° C., rather than at the more usual 300° C. The fourth step typically requires 2 hours.

If a titanium layer has been deposited over the chromium, prior to the subsequent photolithography, the titanium is removed selectively with respect to the underlying chromium by an etching solution of $NH_4OH:H_2O_2$ in a volumetric ratio of 1:2.

In a fifth step 118, the previously deposited grid layer 32 on the frontside of the wafer 20 is photolithographically defined for the front contact pads and the grid pattern.

Figure 4:
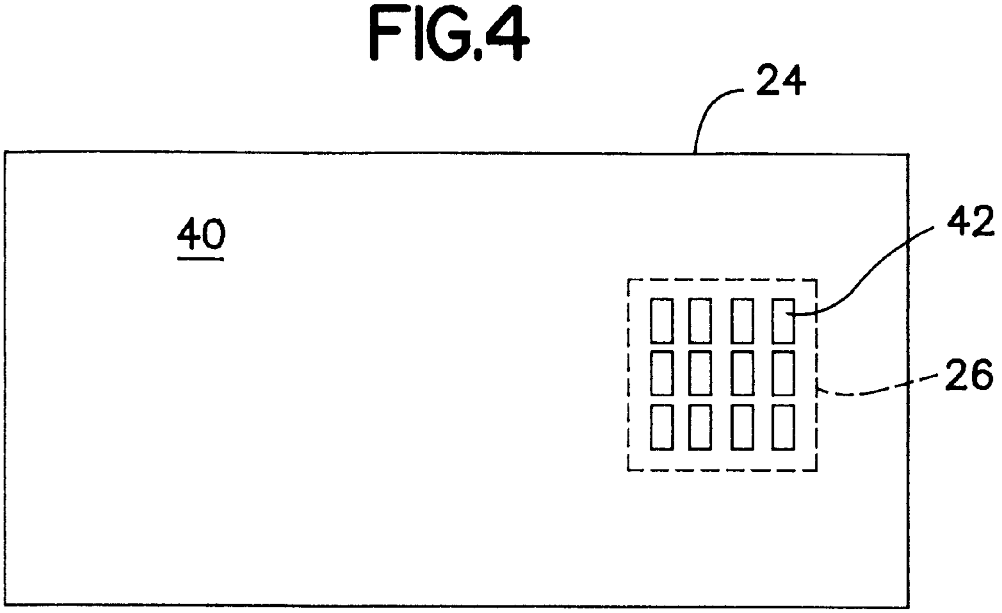
FIG. 4 is a plan view of a photocathode cell of the invention.
Figure 5:
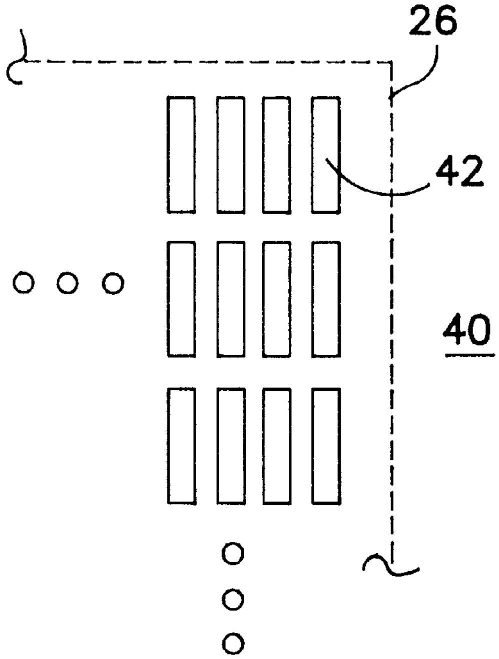
FIG. 5 is an enlarged plan view of the active area of FIG. 5.

The frontside pattern will now be described with reference to one of the 5 mm×10 mm cathode cells 24 shown in top plan view in FIG. 4 with its 2 mm×2 mm active area 26. The frontside contact pad 40 consists of essentially all of the surface of cathode cell 24 except the gridded areas over the active area 26 and metal-free linear traces surrounding the intended scribe lines for cleaving the cells apart. The active area 26 includes a conductive surface mesh pattern formed by apertures 42 through the grid metal layer 32 and underlying thin $SiO_2$ layer 30. As shown in the enlarged plan view of FIG. 5, the apertures 42 are arranged in a rectangular pattern. Each aperture 42 has a width of 5 $\mu$m and a length of 50 $\mu$m. The apertures 42 are separated by vertical and horizontal grid lines, all of a width of 1.5 $\mu$m, which are directly connected to the front contact pad 40.

In the fifth step 118, the previously deposited metal layer 32 on the frontside of the wafer 20 is photolithographically defined for the front contact pads and the grid pattern. The photolithographic mask is patterned to cover all the front surface except the areas of the intended apertures 42 and cleave traces. The wafer is then etched in a two-step process. In a first step, the exposed chromium is etched with CR-7 etchant available from Cyantek and in a second step the underlying silica is etched with a buffered oxide etch principally comprising hydrofluoric acid and ammonia bifluoride, available from Transene Corporation to expose, as shown in the cross section of FIG. 1, the underlying InP in the area of the apertures 42. The InP semiconductor heterostructure must be exposed because electrons are to be emitted from the InP through the apertures 42. The fifth step typically requires 4 hours.

In a sixth step 120, the thirty-two cathode cells 24 simultaneously formed in the preceding five steps 110 through 118 are diced from the single wafer 20 by a cleaving process in which a diamond stylus scribes the surface of the wafer along the two perpendicular (001) crystal directions along the intended chip boundaries, which lie within the previously described metal-free scribe traces, and the chips are then snapped apart over a sharp edge underlying the scribe line. It is noted that the round cathodes of the prior art required grit blasting to separate the disks, thus wasting much valuable InP between the disks. On the other hand, the oriented wafer 20 is cleanly cleaved in the sixth step 120 along (100) crystallographic planes to virtually eliminate wastage. Even more InP area could be utilized if the contact pad 40 outside of the active area 26 were further reduced in size. The dicing step typically requires 1 n hours.

The process steps 110 through 120 of the invention are summarized in TABLE 2.

TABLE 2

| | | |
|---|---|---|
| 1 | Deposit $SiO_2$ on front | 1 hour |
| 2 | Deposit grid metal on front | 3 hours |
| 3 | Mask back and deposit ohmic contact | 4.5 hours |
| 4 | Mask back and deposit AR Coating | 2 hours |
| 5 | Mask front and etch contact grid pattern | 4 hours |
| 6 | Dice | 1.5 hours |
| TOTAL | | 16 hours |

It is seen that a total of 16 hours of operator processing time is required. An average run yields 22 of the 32 possible cathode cells. Therefore, about 44 minutes of operator time are required for each finished and good cathode cell. This is a reduction of a factor of nine in labor over the prior art process summarized in TABLE 1. Furthermore, the typical yield for a 2-inch wafer of 22 photocathodes of the invention is ten times the yield of two round cathode disks of the prior art, thus significantly reducing the fixed costs of the expensive epitaxially grown cathode heterostructure.

Figure 6:
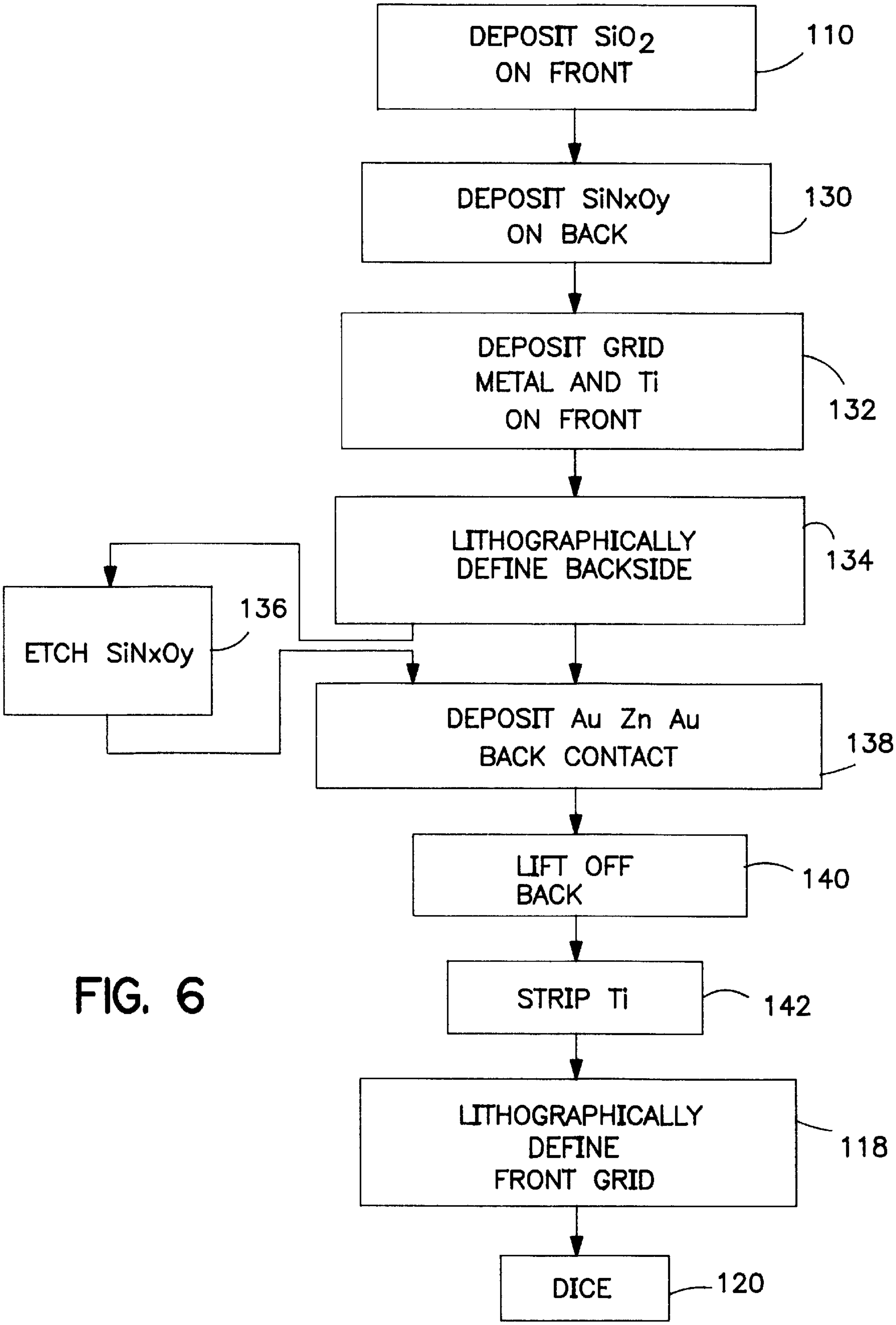
FIG. 6 is a flow diagram of a second process sequence of the invention, generally accomplishing the same results as the process of FIG. 3.

An alternative fabrication method for the contact disk inside the photocathode cell is illustrated in the processing flow diagram of FIG. 6.

In the first step 110, the thin layer of $SiO_2$ is deposited on the front of the wafer. The wafer is then flipped, and in step 130 an unpatterned anti-reflective coating layer of $SiN_yO_x$ is PECVD deposited at 300° C. on the back of the wafer. The wafer is then passed to the e-beam evaporation chamber where in step 132 there are deposited on its frontside first a 50 nm layer of Cr and then a 20 nm layer of Ti.

In step 134, the $SiN_xO_y$ layer on the backside is photolithographically defined to leave exposed areas for backside contacts but to cover the area of the intended $SiN_xO_y$ anti-reflection coating. The titanium layer greatly facilitates the photolithography. In step 136, the exposed $SiN_xO_y$ is etched away with a buffered oxide etch of ammonia bifluoride and hydrofluoric acid. In step 138, a back contact layer of AuZnAu is deposited into the defined pattern, and then in step 140 the remaining photoresist and overlying AuZnAu are lifted off. The double use of the photoresist mask in steps 136 and 140 provide self-alignment between the anti-reflective coating and the electrode on the back and also saves one photolithographic step, a savings of about one hour of labor.

The processing then returns to the front. The titanium is stripped in step 142 with $NH_4OH+H_2O_2$ (ammonium hydroxide and peroxide), and in step 118 the chromium is photolithographically defined into the grid pattern using the CR-7 etchant.

Figure 7:
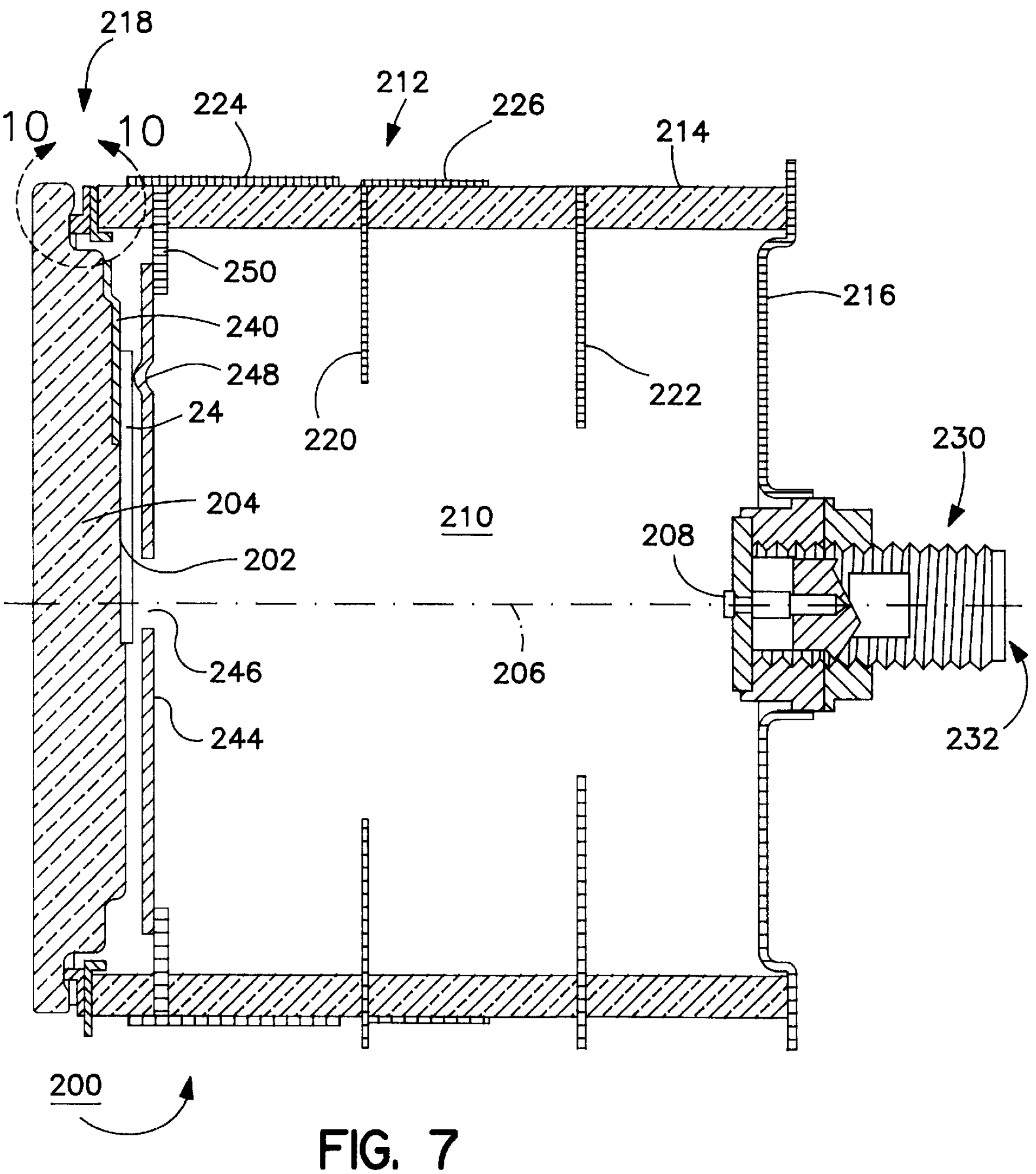
FIG. 7 a cross-sectional view of a first embodiment of the hybrid photomultiplier tube of the invention.

After the dicing of step 120, each diced photocathode cell is assembled into a hybrid photomultiplier tube 200 illustrated in cross section in FIG. 7. This structure is closely related to that disclosed by LaRue et al. in the above cited patent, incorporated herein by reference. The cathode cell 24 is placed in a recess 202 formed in the inner surface of a glass window 204. The active area 26 with included apertures 42 of the cathode cells 42 is aligned with a central axis 206 and faces a photodiode 208 disposed within a vacuum region 210 defined by a vacuum envelope 212. The side of the cathode cell 24 facing the window disk 204 receives light through the window which is essentially transparent at the optical wavelengths of interest.

The vacuum region 210 is typically maintained at a pressure of $10^{-10}$ torr so that electrons emitted from the active area 26 of the cathode cell 24 traverse the vacuum region 210 and are collected by the photodiode 208. The vacuum envelope 212 is principally composed of the disc-shaped window 204, a longitudinally segmented tubular ceramic sidewall 214, and a metallic disc-shaped backwall 216, which also serves as an electrode that is approximately grounded. A connection 218 between the sidewall 214 and the window 204 will be described later.

Two annular electrodes 220 and 222 are disposed between the photocathode cell 24 and the photodiode 208 in a configuration symmetric about the central axis 206. Unillustrated electrical leads for the two electrodes 220 and 222 and for the photocathode extend through the vacuum envelope 212 so that the active area 26 of the cathode cell 24 emits electrons generally toward the photodiode 208 the electrodes 220 and 222 can be biased to focus the emitted electrons onto the photodiode 208.

For reasons explained by LaRue et al., two annular conducting shields 224 and 226 on the outside of the ceramic sidewall 214 are connected respectively to the front contact to the photocathode cell 24 and to the first electrode 220.

The photodiode 208 is supported upon a connector assembly 230 at a location on the central axis 206. The connector assembly 230 has a coaxial RF connector 232 to the photodiode 208 so that the electrons collected by the photodiode 208 can be measured by attached electronic equipment. In general, the sheath of the coaxial cable is electrically connected to the back electrode 216 and to the emitter of the photodiode 208 while the center conductor is electrically connected to the anode of the photodiode 208. It is to be understood that the term photodiode is used because such commonly known semiconductor devices can detect electrons as well as photons. Other electron detectors would also work effectively as long as they yield high gain on the first strike of the photo-electron, as has been described by LaRue et al. in the previously cited patent.

As will be described in more detail later, a conductive trace 240 is laid over the window 204 so as to electrically contact the bottom contact 34 of the photocathode cell 24. As will also be described in more detail later, a generally disk-shaped cathode contact 244 having a central aperture 246 over the active area 26 of the cathode cell 24 has a dimpled area 248 biased against and electrically contacting the contact area of the top planar layer 32 of the photocathode cell 24. The cathode contact 244 is electrically contacted to and biased toward the photocathode cell 24 by an annular contact ring 250, for example of Kovar, extending through the sidewall 214 and electrically connected to the annular conducting shield 224.

Figure 8:
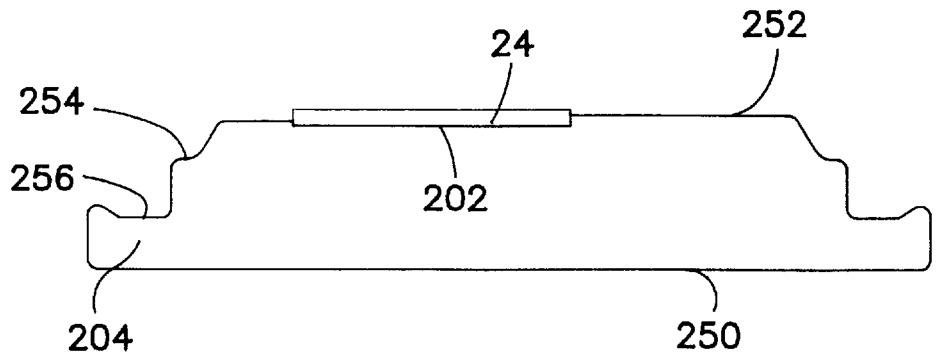
FIG. 8 is a cross-sectional view of the inventive assembly of the window and cathode cell taken along sectional line 8—8 of FIG. 9.
Figure 9:
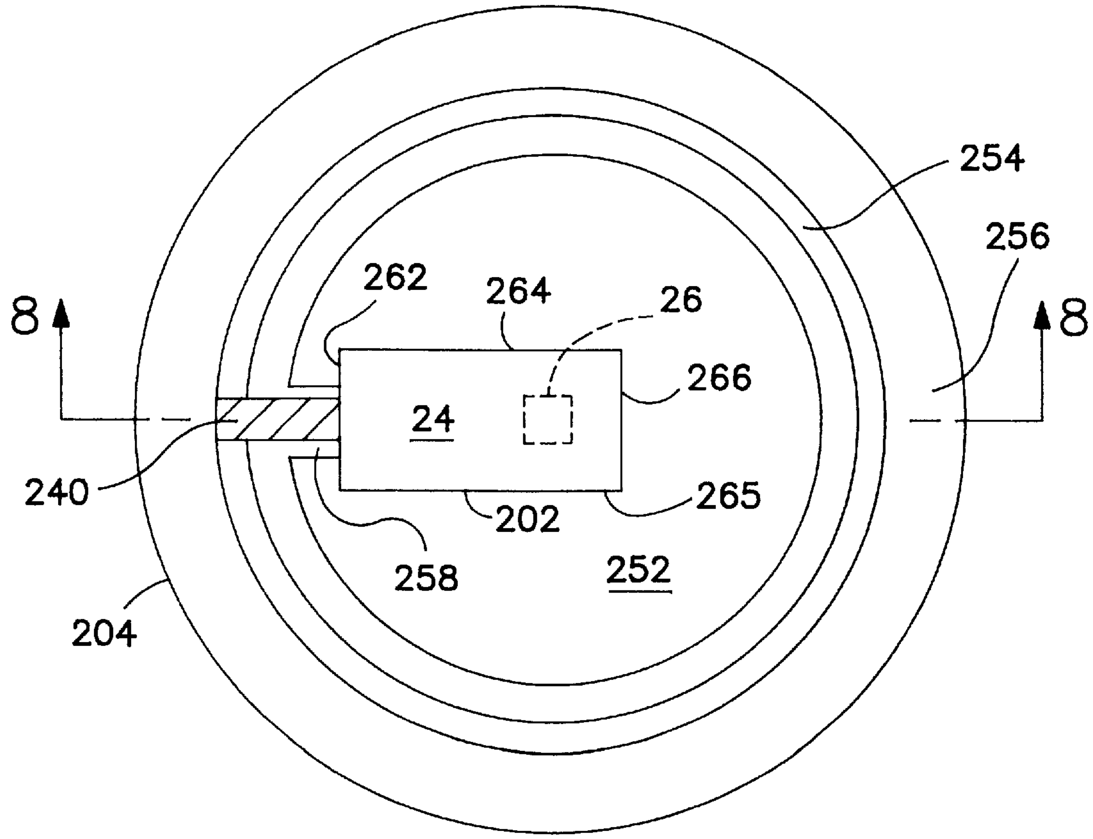
FIG. 9 is a plan view of the assembly of FIG. 8.

FIGS. 8 and 9 show respectively an enlarged cross-sectional view and an inside plan view of the window disk 24. By "inside" is meant on the side intended to face the vacuum region 210. Grinding, mechanical polishing, and fire polishing are used to form the window disk 24 from Corning 7056 borosilicate glass (BSG) to a cylindrical shape having a planar outside face 250 and a smaller planar inside face 252. The shape also includes an annular shoulder 254 and an annular trough 256 at the inside perimeter. Then a coining process, to be described below, is used to form the recess 202 for the cathode cell 24 and an connected recess 258 to the area of the shoulder 254. The cathode recess 202 is formed to a depth that is slightly less than the thickness of the cathode cell 24 such that the cell 24 inserted therein projects slightly above the inside planar surface 252. It is formed to a length and width that are slightly larger than those of the cathode cell 24. For example, the cathode recess is 0.200"×0.400" (5.08 mm×10.16 mm) for a 5 mm×10 mm cathode cell so that the recess is only a few tens of microns larger than the cathode cell. The connecting recess 258 is formed to the same depth and to a width smaller than that of the cathode recess 202 so that opposed and perpendicular sides 262, 264, 265, and 266 of the cathode recess 202 align and laterally hold the cathode cell 24 placed within the cathode recess 202. The cathode recess 202 is positioned so that the active area 26 of the cathode cell 24 is aligned to the center of symmetry of the window disk 204.

The coining process is similar to that used to forge coins. A pair of dies composed of graphite, for example, are formed with the inverse of the desired shape, in this case, the bottom die is planar except for positioning indices and the top die is formed with an inverse pattern of the cathode recess 202 and the connecting recess 258. The top die is additionally formed with two boss flats oriented at about 60° with respect to the bottom of the active area 26 so as to prevent the top graphite die and glass disk from rocking during the coining process. The as-yet circularly symmetric window disk 204 is placed between the dies and heated to a temperature at which the glassy material has somewhat softened but below its melting point. A preferable temperature range is ±20° C. of the glass softening temperature, and more preferably below the softening temperature. In the case of 7056 BSG glass, a most preferable forging temperature is about 690° C. The dies are then pressed together with a force of about 20 pounds (8.3 kgf) so as to emboss the die pattern onto the window disk 204.

The trace 240 is then formed on the inner face of the window disk 204 by mechanical masking and vacuum evaporation of metals. FIG. 8 does not show the trace because of its thinness and the dimensional accuracy of this figure. The trace 240 extends part way into the cathode recess 202 so as to electrically contact the back ohmic contact 34 of the cathode cell 24. It extends outwardly through the connecting recess 240, onto the shoulder 254, and into the trough 256. The vertical structure of the trace 240 is a sandwich structure comprising a lower titanium layer which acts as a glue layer to the BSG glass and a top layer of gold which electrically conducts and wets to indium.

The trace 240 on the window disk 204 is scraped over with indium in the area to underlie the back ohmic contact 34 of the cathode cell 24. Because the cathode is intended to ballistically transport electrons, minimum surface scattering is desired. Therefore, the electron-emitting surface of the photocathode must be atomically clean and requires a final vacuum processing step before its assembly into the photomultiplier tube of FIG. 6. Accordingly, the entire cathode cell 24 is first subjected to a final etch with $H_2SO_4$:$H_2O_2$:$H_2O$ and is immediately pressed into the indium on the inside of the window disk 204, and the assembly is then heat cleaned at 400 to 500° C. in a vacuum chamber. The heating causes a vacuum braze between the cathode cell 24 and the window disk 204 as a result of the indium melting and thus joining the back ohmic contact 34 of the cathode cell 24 to the trace 240. The brazing mechanically bonds the cathode cell 24 to the window disk 204 via the indium and electrically contacts the back ohmic contact 34 of the cathode cell 24 to the indium in the trace 240. A layer of CsO is deposited over the side of the cathode cell 24 with the active area to lower the effective electron surface potential at the surface to promote electron emission. A thin layer of metal may optionally be deposited before the deposition of the CsO in order to lower the electrical resistance across the Schottky barrier.

Figure 10:
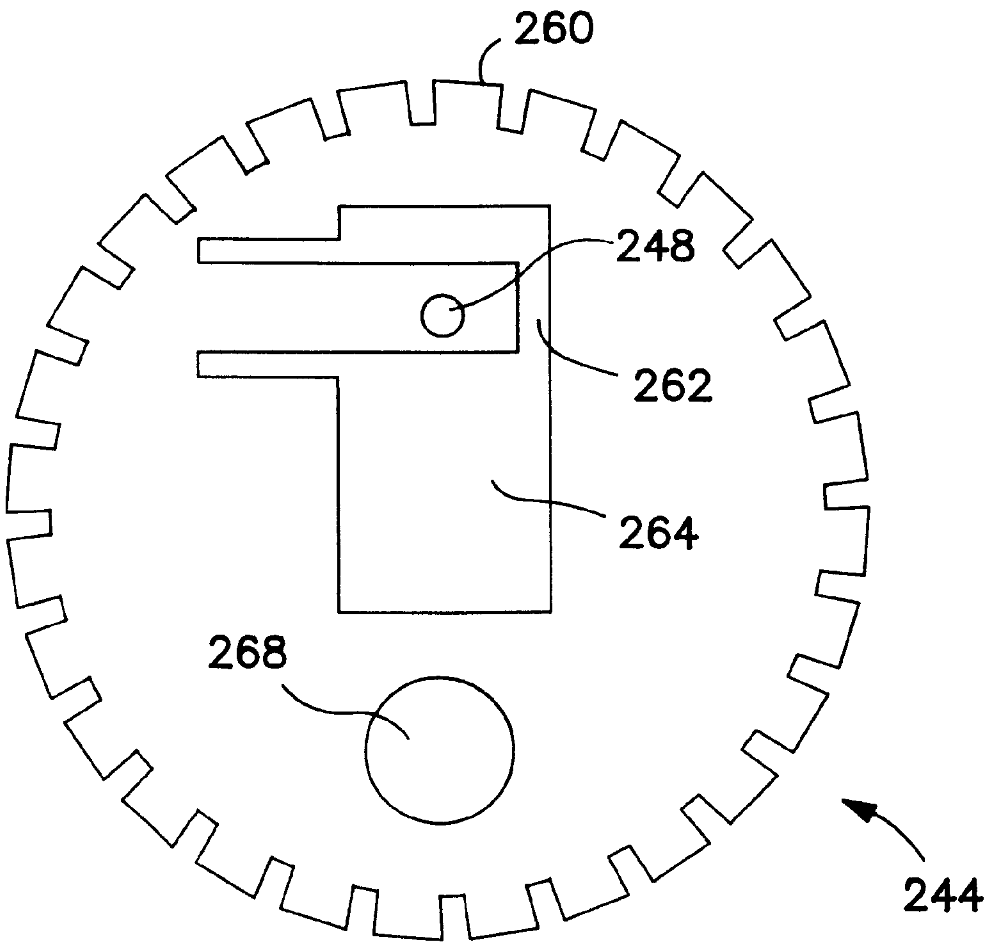
FIG. 10 is a plan view of a first embodiment of the cathode contact disk usable in the assembly of FIG. 8.

The contact disk 244 is shown in more detail in the plan view of FIG. 10. It is formed, for example, from 5-mil (125 μm) Kovar sheet stock to have a diameter, for example of 0.88" (2.24 cm), such that multiple tabs 250 at its periphery can contact the annular electrode 250 of FIG. 7. A generally rectangular aperture 262 is formed at its center to include a central rectangular aperture 264 leaving exposed the underlying active area 26 of the cathode cell 24. A finger 266 extends into the larger aperture 262 and has on its distal end the dimple 248 (for instructional purposes, the cross-sectional view of FIG. 7 does not accurately convey this structure) that contacts the inside pad area 32 of the cathode cell 24. The finger 266 compressively holds the dimple 248 against the pad area 32 so as to electrically contact it and to bias the contact disk 244 between the cathode cell 24 and the annular electrode 250. A circular aperture 268 is formed in the contact disk 244 on the side of the active-area aperture 264 opposite the dimple 248 for the purposes of brazing the contact disk 244 to the underlying cathode cell 24.

Figure 11:
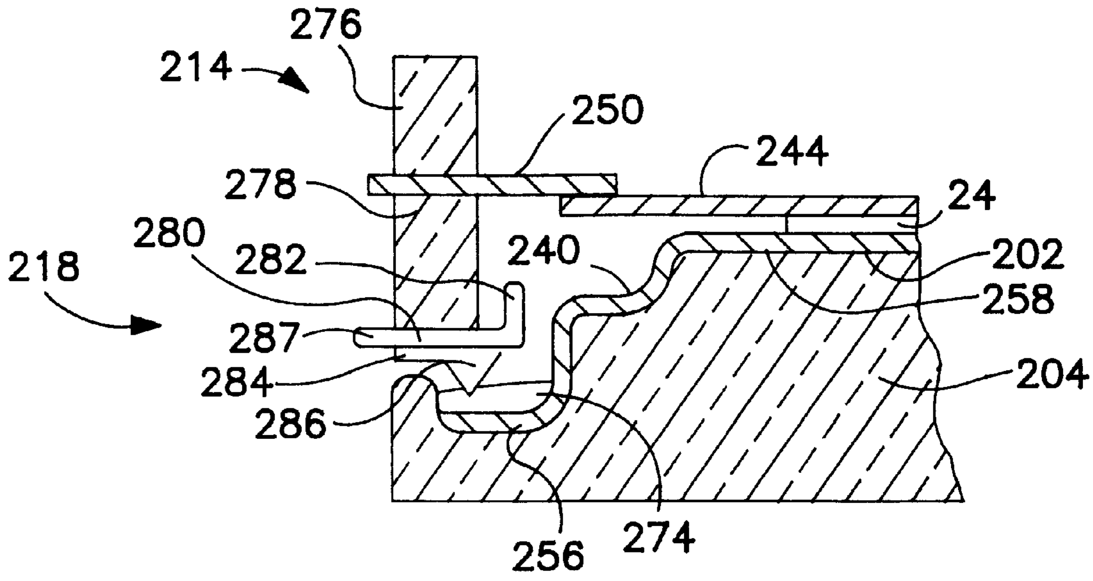
FIG. 11 is an enlarged cross-sectional view of part of the photomultiplier tube including the window, cathode, and sidewall.

FIG. 11 shows an enlarged cross section of the window disk 204 at its side having the cathode recess 202 and connecting recess 258. It also shows indium 274 filled into the annular trough 256 at least partially on top of the conducting trace 240. The assembly on the right side of FIG. 7 is prepared ahead of time and includes, as shown in the enlarged cross section of FIG. 11, two annular spacers 276 and 278, for example of alumina, which are copper brazed to the annular electrode 250 and to a flange 280 having an upwardly turning lip 282 and to an annular base 284 having a downwardly pointing annular knife edge 286. These latter two elements 280 and 284 can be formed of Kovar. The lip 282 prevents indium from extruding outwardly.

Shortly after the cathode cell 24 has been bonded to the window disk 204, the cathode contact 244 is placed on the cathode cell 24 with its central aperture 246 aligned over the active area 266 and its dimple 248 over the upper contact pad 32 of the cathode cell 24. The cathode cell 24 is then heat cleaned and surface activated with a layer of CsO. The assembly is then pressed downwardly so that the knife edge 297 penetrates into the indium 274 in the trough 256 of the window disk 204 to provide partial mechanical bonding, to vacuum seal the interior 210 of the tube, and to provide an electrical path from the trace 240, through the indium 274 and the knife blade 286 of the annular base 284, to the flange 280 having an external tab 287 to which an electrical lead can be connected. The downward pressing of the assembly causes the cathode contact disk 244 to engage the annular electrode 250 and to further spring load the dimple 248 against the upper contact pad 32 of the cathode cell 24.

Figure 12:
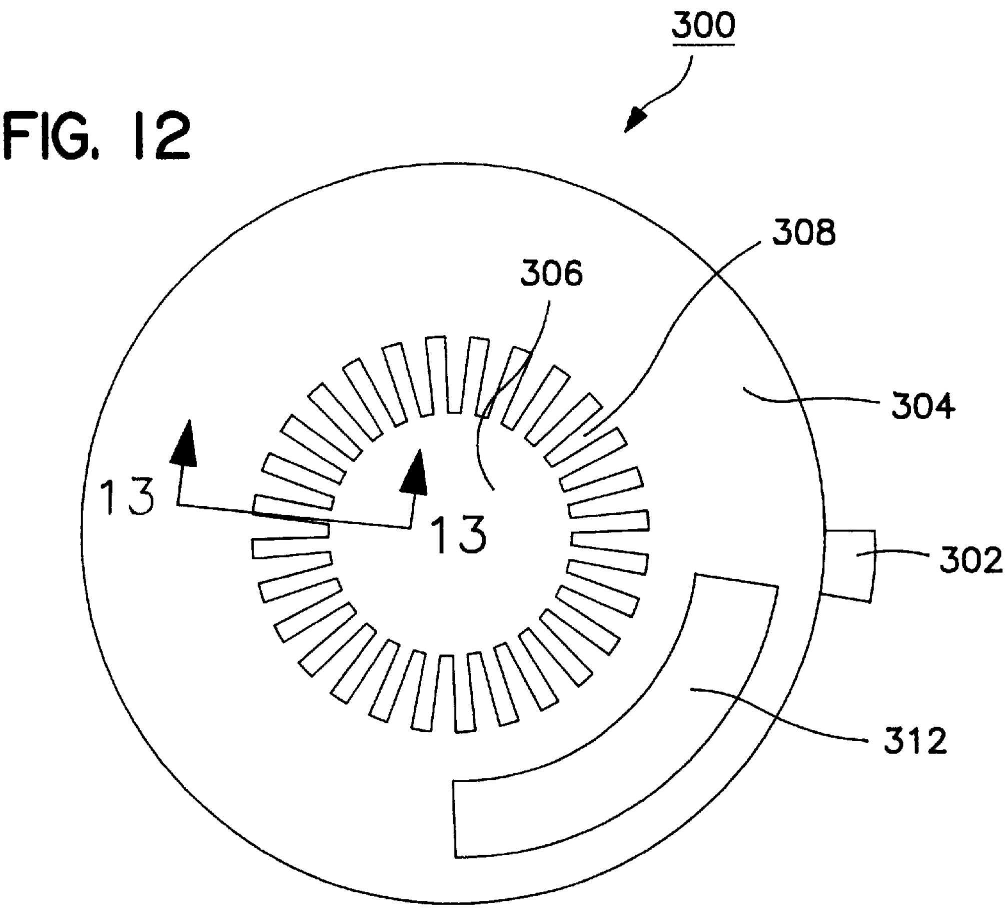
FIG. 12 a plan view of a second embodiment of the cathode contact disk.

An alternative and preferred contact disk 300 is illustrated in plan view in FIG. 12. It is formed from a sheet of Kovar of 10 mils (0.25 mm) thickness to have a generally circular shape with a diameter generally equal to that of the vacuum envelope 212 of the tube. An outer tab 302 protrudes from the circular outer circumference of a generally solid annular flat ring 304. The outer tab 302 provides an electrical contact tab outside the vacuum envelope 212.

Figure 13:
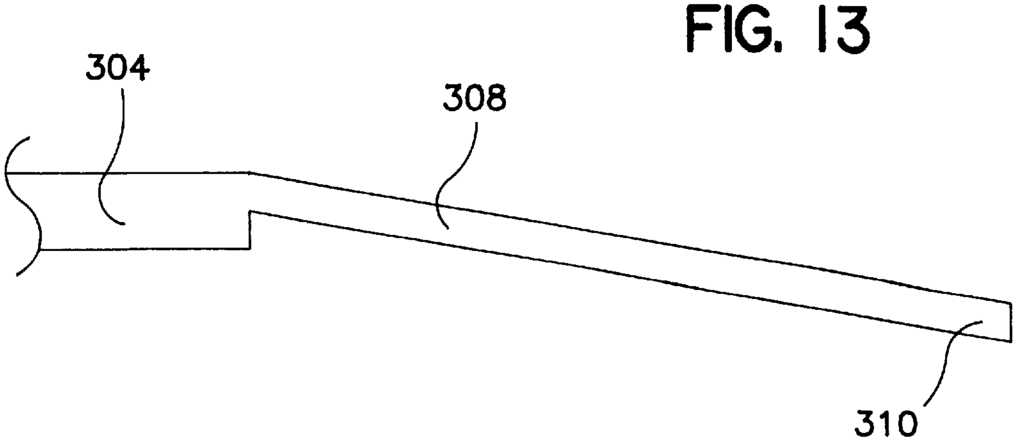
FIG. 13 is a cross-sectional view of a finger of the contact disk of FIG. 12 taken along sectional line 13—13.

A central aperture 306 is formed in the Kovar sheet to have an unobstructed circular center of diameter 0.404 inch (1.026 cm), thus assuring a clear view from the active area 26 of the photocathode cell 24. Twenty-eight finger-shaped inner tabs 308 are equally spaced about the central aperture 306 and extend from the inner circumference of the flat ring 304 towards the center. As shown in the enlarged cross-sectional view in FIG. 13, each inner tab 308 is formed by thinning the Kovar sheet by half and deforming each inner tab 308 downwardly (that is, toward the photocathode) by about 10° so that a tab tip 310 lies beneath the plane of the ring 304. The number of the inner tabs 308 and the positions of the tab tips 310 are chosen such that, regardless of the azimuthal orientation of the contact disk 300, at least one tab tip 310 compressively contacts the contact pad of the photocathode cell 24 mounted in the tube. An arc-shaped hole segment 312 is removed from the flat ring 304 to allow mounting of a getter, to be described later.

Figure 14:
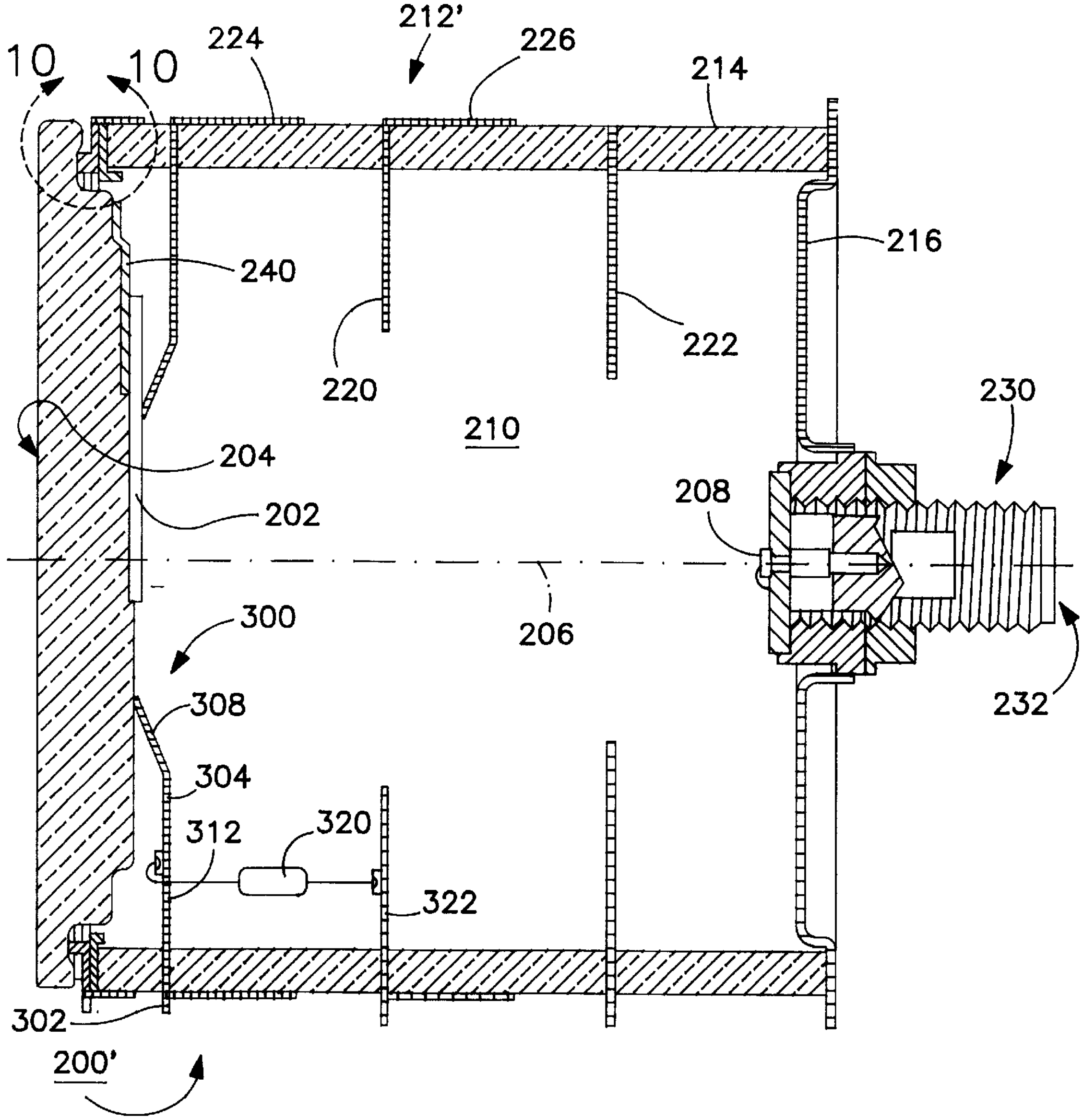
FIG. 14 is a cross-sectional view of a second embodiment of the hybrid photomultiplier tube of the invention using the contact disk of FIG. 12.

The modified contact disk 300 is incorporated into a modified tube 200' illustrated in cross section in FIG. 14. The contact disk 300 extends to the outside of a modified vacuum envelope 212' with its outer 302 ready for soldering to an electrical wire. When the contact disk 300 is placed on the ceramic stack existing on the right side of FIG. 13, its inner tabs 308 are directed in the other direction toward the cathode cell 202 to be later added.

Prior to this integration, one lead of a non-evaporable getter 320 is welded to a middle annular electrode 322. When the contact disk 300 is assembled with the vacuum envelope 212', the other lead of the getter 320 sticks through the arc-shaped hole segment 312 of the contact disk 300. Once the contact disk 300 has been brazed into the ceramic stack, the second lead of the getter is available for welding to the outer surface of the contact disk 300. The getter 320 is used to perform a final vacuum pumping of the interior of the vacuum envelope 212 after it has been assembled and sealed. The getter, which is available from SAES Getters/U.S.A., Inc. of Colorado Springs, Colo., is electrically biased during pumping with leads connected to the middle electrode 322 and the contact disk 300 at the exterior of the vacuum envelope 212'.

When the window disk 204 is assembled to the remainder of the vacuum envelope 212', at least one of the inner tabs 208 of the contact disk 300 contacts the contact pad of the cathode cell 202. Others of the tabs 208 either are left floating or harmlessly contact the window disk 204.

Other than for the above differences, the modified tube 200' of FIG. 14 and its assembly do not substantially differ from the tube 200 of FIG. 7 and its assembly.

This description completes the parts of the process that significantly differ from the process of LaRue et al.

Figure 15:
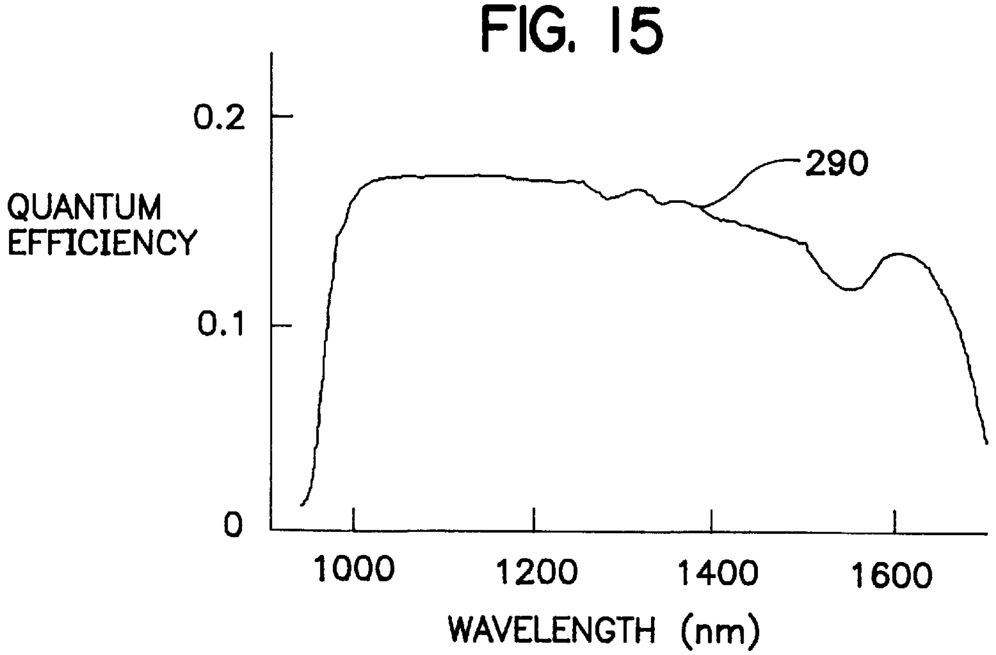
FIG. 15 is a graph of the spectral dependence of quantum efficiency for an experimentally achieve embodiment of the invention.
Figure 16:
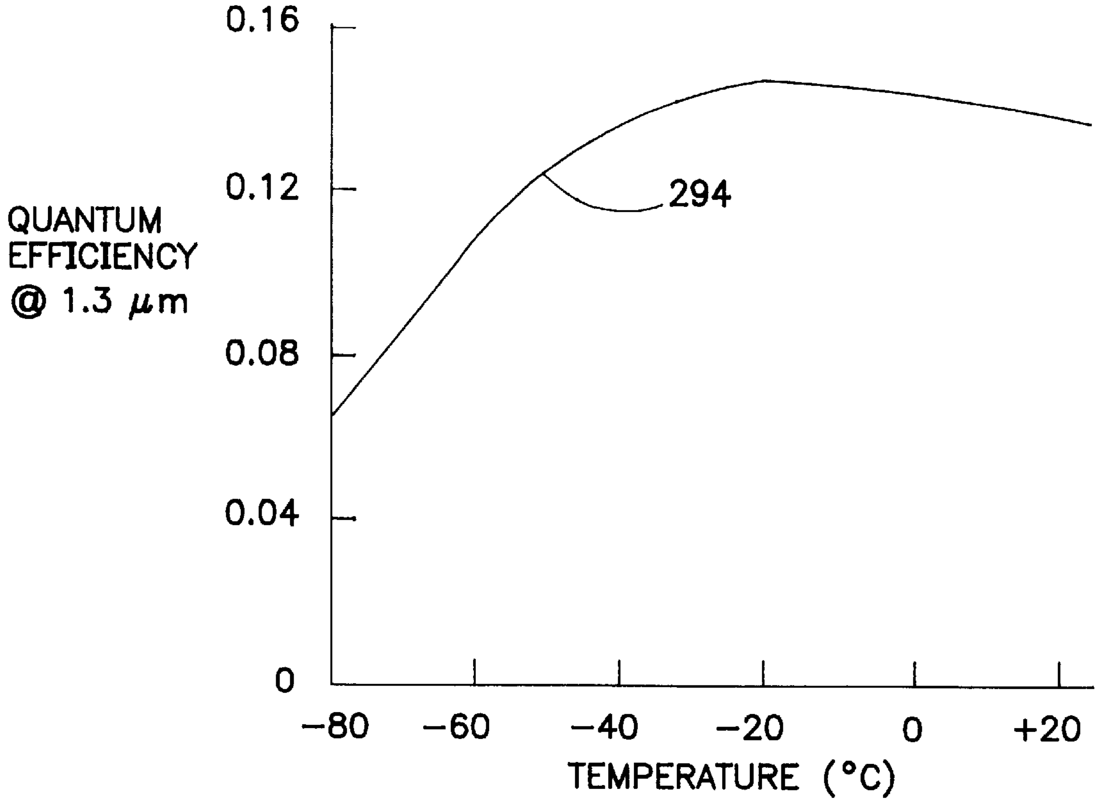
FIG. 16 is another graph of the temperature dependence of the quantum efficiency for the same device as for FIG. 15.

Several TE-IPD devices were built and tested. One of the best demonstrated an experimentally determined external quantum efficiency of about 24% at 1300 nm at room temperature and an applied voltage of 300V across the tube. FIG. 15 shows a quantum efficiency curve 15 from a TE cathode operating outside the IPD tube at wavelengths between 1000 and 1650 nm. As shown by curve 294 in FIG. 16, the quantum efficiency rises somewhat at lower temperatures, but begins falling again below −30° C.

The short-wavelength response is limited by the bandgap of the InP substrate. This could be eliminated and the response extended down to 500 nm if the cathode heterostructure were grown in the opposite order, the heterostructure were bonded to the glass window with the substrate side up, and then the substrate were etched away.

As discussed before, noise is an equally important parameter as response. Noise includes many types of unintended and usually random signals. If the noise greatly exceeds the signal response, that is, the signal-to-noise ratio is too low, then the signal cannot be measured. Noise is usually expressed in terms of noise-effective power (NEP). Table 3 shows calculated NEP for two comparative examples. The first is an InGaAs p-I-n diode, and the second is an InGaAs avalanche photo-detector (APD).

TABLE 3

| Type | NEP (signal limited) | NEP (dark current limited) | NEP (amplifier limited) | Total NEP |
|---|---|---|---|---|
| p-I-n | 47 pW | 771 pW | 37.3 nW | 37.4 nW |
| APD | 217 pW | 1.87 nW | 3.81 nW | 4.25 nW |
| TE-IPD | 469 pW | 2.75 nW | 286 pW | 2.81 nW |
| 4 mm$^2$ | | 389 pA @ −30° C. | | 673 pW @ −30° C. |
| TE-IPD | 469 pW | 1.37 nW | 286 pW | 1.48 nW |
| 1 mm$^2$ | | 194 pA @ −30° C. | | 582 pW @ −30° C. |

The table also shows the NEP for two embodiments of the invention, one a TE-IPD with the area 2 mm×2 mm of the above fabricated example and a smaller one having an area of 1 mm$^2$. Values were calculated from experimental values and extrapolated to the smaller device. The dark-current is given for the inventive devices at room temperature and at −30° C. It is thus seen that the invention can provide better performance than other photodetectors, especially if it is cooled.

Although the invention has been primarily described in the context of a transferred-electron intensified photo-diode (TE-IPD), the invention is not so limited. The transferred-electron photocathode can be applied to other applications, for example, wide-area imagers or streak cameras.

The invention thus provides a number of ways to simplify and reduce the cost of high-performance opto-electronic devices, especially transferred-electron photocathodes III–V semiconductors, in which multiple photocathodes may be processed in parallel and then easily assembled into detector devices.

The invention can be extended and improved in a number of ways. For example, with minor modifications to the TE-IPD and the method in which the cathodes are mounted and contacted, several could be incorporated into a single TE-IPD vacuum envelope. For example, three cathodes could be incorporated into one vacuum envelope and be individually biased with long wavelength cut-offs at 1.65 μm, 1.4 μm, and 1.2 μm respectively, for example.

Also, the dark current of TE cathodes is reduced as the long-wavelength cut-off is shortened. Therefore, the lowest overall NEP is obtained when a cathode is used which has a long-wavelength cut-off just beyond the wavelength of interest.

Although the invention has been described with reference to TE-IPDs, it is not so limited. The invention may be used with many other opto-electronic devices, especially those that need to be melded into a larger assembly, but which should be processed in parallel as much as possible. In particular, the light-sensitive portion of the opto-electronic circuit may be not only the light-receiving portion of a photodetector but may also be a light-emitting portion of a photo emitter. Also, the upper portion of the opto-electronic chip is not limited to an electron emitter, but may simply be an electronic or opto-electronic circuit formed therein.

What is claimed is:

1. An intensified photo-cell, comprising:

a vacuum envelope including a window on a side thereof;

a conducting trace formed on a side of said window facing an interior of said vacuum envelope and electrically connected to an exterior of said vacuum envelope;

a transferred electron cathode cell having a substantially rectangular shape brazed to said conducting trace, receiving light from a first side thereof facing said window and emitting electrons from a second side opposed thereto; and an electron detector being positioned within said vacuum envelope opposite to said transferred electron cathode cell having a receiving side facing said interior of said vacuum envelope and disposed to receive said emitted electrons.

2. An intensified photo-cell as recited in claim 1, wherein said electron detector comprises a photo-diode.

3. An intensified photo-cell as recited in claim 1, further comprising a conducting grid electrically connected to an outside of said vacuum envelope, formed on said second side of said cathode cell, and including apertures therethrough for emission of said electrons toward said electron detector.

4. An intensified photo-cell as recited in claim 1, wherein a rectangular recess is formed in said window that receives and aligns said cathode cell.

5. An opto-electronic device, comprising:

a substantially rectangular opto-electronic chip having a first principal side comprising a portion that is sensitive to light and a second principal side having electronic structure formed thereon; and a glass window member having a first recess formed in a face therein which generally conforms in shape and size to said opto-electronic chip;

wherein said opto-electronic chip is fitted into said first recess with said first principal side facing said glass window member, whereby said light sensitive portion of said chip is operative with light transmitted through said glass window.

6. An opto-electronic device as recited in claim 5, wherein said opto-electronic chip comprises a photocathode, a light receiving portion of said photocathode being included in said light sensitive portion and an electron-emitting portion of said photocathode being included in said electronic structure.

7. An opto-electronic device as recited in claim 6, wherein said photocathode comprises a transferred-electron photocathode.

8. An opto-electronic device as recited in claim 5, wherein said first recess has four sides for engaging four sides of said opto-electronic chip.

9. An opto-electronic device as recited in claim 8, further comprising:

a second recess formed in said glass window member and connected to said first recess; and a conductive layer formed on bottoms of said first and second recesses and connected to said first principal side of said opto-electronic chip.

10. An opto-electronic device in accordance with claim 5 in which said glass window comprises an end of an enclosed outer wall of a vacuum tube and in which said tube includes an output screen at the anode thereof and electron focussing to focus the electrons from said chip onto said output screen.

* * * * *